US011563133B1

(12) United States Patent
Derkacs et al.

(10) Patent No.: US 11,563,133 B1
(45) Date of Patent: Jan. 24, 2023

(54) METHOD OF FABRICATING MULTIJUNCTION SOLAR CELLS FOR SPACE APPLICATIONS

(71) Applicant: SolAero Technologies Corp., Albuquerque, NM (US)

(72) Inventors: Daniel Derkacs, Albuquerque, NM (US); Daniel McGlynn, Albuquerque, NM (US)

(73) Assignee: SolAero Techologies Corp., Albuquerque, NM (US)

( * ) Notice: Subject to any disclaimer, the term of this patent is extended or adjusted under 35 U.S.C. 154(b) by 613 days.

(21) Appl. No.: 15/203,975

(22) Filed: Jul. 7, 2016

Related U.S. Application Data

(63) Continuation-in-part of application No. 14/828,206, filed on Aug. 17, 2015, now abandoned.

(51) Int. Cl.
*H01L 31/0725* (2012.01)
*H01L 31/054* (2014.01)
(Continued)

(52) U.S. Cl.
CPC .......... *H01L 31/0725* (2013.01); *H01L 22/12* (2013.01); *H01L 22/14* (2013.01);
(Continued)

(58) Field of Classification Search
CPC ............. H01L 31/0725; H01L 31/1844; H01L 31/0547; H01L 22/12; H01L 22/14;
(Continued)

(56) References Cited

U.S. PATENT DOCUMENTS 4,881,979 A * 11/1989 Lewis ................. H01L 31/0687
136/249
5,620,529 A * 4/1997 Bassily ................. B64G 1/222
136/245
(Continued)

FOREIGN PATENT DOCUMENTS

DE 102027200700 A1 7/2018
EP 2960950 A1 12/2015
(Continued)

OTHER PUBLICATIONS

Roberta Campesato "High Efficiency Alingap and Alingaas Solar Cells for 32% Four Junction Device" 28th European Photovoltaic Solar Energy Conference and Exhibition, DOI: 0.4229/28thEUPVSEC2013-1BO.12.2, 2013 (Year: 2013).*
(Continued)

*Primary Examiner* — Michael Y Sun

(57) ABSTRACT

A method of fabricating a four junction solar cell having an upper first solar subcell composed of a semiconductor material including aluminum and having a first band gap; a second solar subcell adjacent to said first solar subcell and composed of a semiconductor material having a second band gap smaller than the first band gap and being lattice matched with the upper first solar subcell; a third solar subcell adjacent to said second solar subcell and composed of a semiconductor material having a third band gap smaller than the second band gap and being lattice matched with the second solar subcell; and a fourth solar subcell adjacent to and lattice matched with said third solar subcell and composed of a semiconductor material having a fourth band gap smaller than the third band gap; wherein the fourth subcell has a direct bandgap of greater than 0.75 eV.

18 Claims, 5 Drawing Sheets

(51) Int. Cl.
*H01L 31/18* (2006.01)
*H01L 21/66* (2006.01)
*H01L 31/0687* (2012.01)
*H01L 31/0693* (2012.01)
*H01L 29/737* (2006.01)
*H01L 31/076* (2012.01)
*H01L 27/30* (2006.01)
*H01L 31/04* (2014.01)
*H02S 50/10* (2014.01)
*H01L 31/041* (2014.01)

(52) U.S. Cl.
CPC ...... *H01L 31/0547* (2014.12); *H01L 31/1844* (2013.01); *H01L 22/00* (2013.01); *H01L 27/302* (2013.01); *H01L 29/7378* (2013.01); *H01L 31/04* (2013.01); *H01L 31/041* (2014.12); *H01L 31/0687* (2013.01); *H01L 31/0693* (2013.01); *H01L 31/076* (2013.01); *H01L 31/1852* (2013.01); *H02S 50/10* (2014.12); *Y02E 10/544* (2013.01); *Y02P 70/50* (2015.11)

(58) Field of Classification Search
CPC ....... H01L 31/041; H01L 31/04; H01L 22/00; H01L 27/302; H01L 31/0693; H01L 31/1852; H01L 31/076; H01L 29/7378; H01L 31/0687; H02S 50/10; Y02P 70/50; Y02E 10/544
See application file for complete search history.

(56) References Cited

U.S. PATENT DOCUMENTS

| | | | |
|---|---|---|---|
| 6,218,605 B1* | 4/2001 | Dally | B64G 1/428 136/244 |
| 6,316,715 B1 | 11/2001 | King et al. | |
| 6,660,928 B1 | 12/2003 | Patton et al. | |
| 2002/0195137 A1 | 12/2002 | King et al. | |
| 2005/0155641 A1 | 7/2005 | Fafard | |
| 2006/0144435 A1* | 7/2006 | Wanlass | H01L 31/0687 136/249 |
| 2007/0029446 A1* | 2/2007 | Mosher | B64G 1/10 244/158.1 |
| 2008/0163920 A1* | 7/2008 | Meusel | H01L 31/02168 136/246 |
| 2008/0185038 A1 | 8/2008 | Sharps | |
| 2012/0211068 A1* | 8/2012 | Cornfeld | H01L 31/06875 136/255 |
| 2012/0240987 A1 | 9/2012 | King et al. | |
| 2013/0068278 A1 | 3/2013 | Kataoka | |
| 2013/0228216 A1* | 9/2013 | Cornfeld | H01L 31/06875 136/255 |
| 2014/0182667 A1* | 7/2014 | Richards | H01L 31/035236 136/255 |
| 2014/0246082 A1 | 9/2014 | Juso et al. | |
| 2015/0053257 A1 | 2/2015 | Dimroth et al. | |
| 2016/0380142 A1 | 12/2016 | Guter et al. | |
| 2017/0170354 A1 | 6/2017 | Ebel et al. | |
| 2019/0378948 A1 | 12/2019 | Dimroth et al. | |
| 2020/0243702 A1 | 7/2020 | Meusel et al. | |

FOREIGN PATENT DOCUMENTS

| | | |
|---|---|---|
| EP | 3159942 B1 | 4/2017 |
| EP | 3179521 A1 | 6/2017 |
| EP | 3159943 B1 | 6/2021 |
| WO | 2016015467 A1 | 2/2016 |

OTHER PUBLICATIONS

R. E. Nahory, Applied Physics Letters 33, 659 (1978); doi: 10.1063/1.90455.

Simon Aldridge, The Group 13 Metals Aluminum, Gallium, Indium and Thallium: Chemical Patterns and Pecularities, John Wiley & Sons, 2011.

F. A. Kish, "AlGaInP Light-Emitting Diodes" Semiconductors and Semimetals, vol. 48.

Richard R. King "Advances in High-Efficiency III-V Multijunction Solar Cells" Advances in OptoElectronics vol. 2007, Article ID 29523, 8 pages.

Richard R King, A. Boca, W. Hong, X.-Q.Liu, D. Bhusari, D.Larrabee, K.M. Edmondson, D.C. Law. C. M. Fetzer, S.Mesropian, and N.H. Karam—Band-Gap-Engineered Architectures for High-Efficiency Multijunction Concentrators Solar Cells.—Spectrolab, Inc. A Boeing Company—24th European Photovoltaic Solar Energy Conference, Sep. 21-25, 2009, Hamburg, Germany.

EPO Letter. Communication pursuant to Rule 114(2)EPC, Observations by a third Party, dated Jun. 9 , 2022—European Patent Office, 80298 Munich, Germany.

Koch.Müller Letter, Einwendung gegen die Patentierbarkeit des Gegenstand von EP 3 923349 A1 gemäß Artikel 115 EPÜ,dated Jun. 2, 2022, Heidelberg, Germany.

Development of Upright Metamorphic 4J Space Solar Cells W.Guter, L.Ebel, M. Meusel, F.Dunzer, C.Wächter, W. Köstler, B.Fuhrmann Space Power Workshop , May 17, 2017, Manhattan Beach, CA.

* cited by examiner

METHOD OF FABRICATING MULTIJUNCTION SOLAR CELLS FOR SPACE APPLICATIONS

REFERENCE TO RELATED APPLICATIONS

This application is a continuation-in-part of U.S. patent application Ser. No. 14/828,206 filed Aug. 17, 2015.

This application is related to co-pending U.S. patent application Ser. No. 14/660,092 filed Mar. 17, 2015, which is a division of U.S. patent application Ser. No. 12/716,814 filed Mar. 3, 2010, now U.S. Pat. No. 9,018,521; which was a continuation in part of U.S. patent application Ser. No. 12/337,043 filed Dec. 17, 2008.

This application is also related to co-pending U.S. patent application Ser. No. 13/872,663 filed Apr. 29, 2013, which was also a continuation-in-part of application Ser. No. 12/337,043, filed Dec. 17, 2008.

This application is also related to U.S. patent application Ser. No. 14/828,197, filed Aug. 17, 2015.

All of the above related applications are incorporated herein by reference in their entirety.

BACKGROUND OF THE INVENTION

Field of the Invention

The present disclosure relates to solar cells and the fabrication of solar cells, and more particularly the design and specification of a lattice matched multijunction solar adapted for specific space missions and high temperature "end of life" performance objectives.

Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to properly specify and manufacture. Typical commercial III-V compound semiconductor multijunction solar cells have energy efficiencies that exceed 27% under one sun, air mass 0 (AM0) illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, and applications anticipated for five, ten, twenty or more years, the power-to-weight ratio and lifetime efficiency of a solar cell becomes increasingly more important, and there is increasing interest not only the amount of power provided at initial deployment, but over the entire service life of the satellite system, or in terms of a design specification, the amount of power provided at the "end of life" (EOL).

The efficiency of energy conversion, which converts solar energy (or photons) to electrical energy, depends on various factors such as the design of solar cell structures, the choice of semiconductor materials, and the thickness of each subcell. In short, the energy conversion efficiency for each solar cell is dependent on the optimum utilization of the available sunlight across the solar spectrum as well as the "age" of the solar cell, i.e. the length of time it has been deployed and subject to degradation associated with the temperature and radiation in the deployed space environment. As such, the characteristic of sunlight absorption in semiconductor material, also known as photovoltaic properties, is critical to determine the most efficient semiconductor to achieve the optimum energy conversion to meet customer requirements of intended orbit and lifetime.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, the photons in a wavelength band that are not absorbed and converted to electrical energy in the region of one subcell propagate to the next subcell, where such photons are intended to be captured and converted to electrical energy, assuming the downstream subcell is designed for the photon's particular wavelength or energy band.

The individual solar cells or wafers are then disposed in horizontal arrays or panels, with the individual solar cells connected together in an electrical series and/or parallel circuit. The shape and structure of an array, as well as the number of cells it contains, are determined in part by the desired output voltage and current.

The electrical characteristics of a solar cell, such as the short circuit current ($J_{sc}$), the open circuit voltage ($V_{oc}$), and the fill factor (FF), are affected by such factors as the number of subcells, the thickness of each subcell, the composition and doping of each active layer in a subcell, and the consequential band structure, electron energy levels, conduction, and absorption of each subcell, as well as its exposure to radiation in the ambient environment over time. The overall power output and conversion efficiency of the solar cell are thereby affected in different and often unpredictable ways. Such factors also vary over time (i.e. during the operational life of the system).

The designation and specification of such parameters is a non-trivial engineering undertaking, and would vary depending upon the specific space mission and customer design requirements. Such design variables are interdependent and interact in complex and often unpredictable ways. Accordingly, it is evident that the consideration of any one material design parameter or variable, such as the amount of a particular constituent element in a layer, and therefore the resulting band gap of that layer, affects each of the electrical characteristics $J_{sc}$, $V_{oc}$ and FF in a different way, sometimes in opposite directions. and such changes does not predictably lead to an increase in power out or solar cell efficiency. Stated another way, focus on any one such material parameter in the design of a multijunction solar cell is not a viable calculus since each variable standing alone is NOT a simple "result effective" variable that can be automatically adjusted by those skilled in the art confronted with complex design specifications and practical operational considerations in order to achieve greater power output or a related design objective.

To reinforce the above observation, the present disclosure identifies a combination of two electrical parameters associated with a subcell and notes how the value of the combination changes over the generational lifetime of the solar cell, which is different for each subcell (since each subcell has a different band gap).

The electrical parameter of consideration taught by the present disclosure is the difference between the band gap and the open circuit voltage, or ($E_g/q-V_{oc}$), of a particular active layer. The value of such parameter may vary depending on subcell layer thicknesses, doping, the composition of adjacent layers (such as tunnel diodes), and even the specific wafer being examined from a set of wafers processed on a single supporting platter in a reactor run, but consideration of that parameter has led to new design conditions in improving the end-of-life efficiency of a multijunction solar cell.

SUMMARY OF THE DISCLOSURE

Objects of the Disclosure

It is an object of the present disclosure to provide increased photoconversion efficiency in a multijunction solar cell for space applications over the operational life of the photovoltaic power system.

It is another object of the present disclosure to provide in a multijunction solar cell in which the selection of the composition of the subcells and their band gaps maximizes the efficiency of the solar cell at a predetermined high temperature (in the range of 40 to 100 degrees Centigrade) in deployment in space at AM0 at a predetermined time after the initial deployment, such time being at least fifteen years.

It is another object of the present invention to provide a lattice matched four junction solar cell in which the current through the bottom subcell is intentionally designed to be substantially greater than current through the top three subcells when measured at the "beginning-of-life" or time of initial deployment.

Some implementations of the present disclosure may incorporate or implement fewer of the aspects and features noted in the foregoing objects.

Features of the Invention

Briefly, and in general terms, the present disclosure provides a method of fabricating a four junction solar cell for deployment in space in an AM0 environment comprising providing a defined predetermined time and defined temperature in the range of 40° to 100° Centigrade after initial deployment, such time being at least one year; determining the amount of radiation experienced by the solar cell after deployment at the predetermined time in the specific earth orbit after deployment; simulating the effect of such radiation and temperature on a plurality of upper first, second and third solar subcell candidates for implementation; identifying the composition and band gaps of the upper first, second and third subcells that maximizes the efficiency of the solar cell at that predetermined time; fabricating one or more four-junction test solar cells in accordance with the identified composition and band gaps of the upper first, second and third subcells; performing one or more optical or electrical tests on the fabricated one or more four-junction test solar cells; based on results of the tests, determining one or more properties of at least one of the upper first, second or third subcells to be modified in subsequent fabrication of four-junction solar cells, including the amount of aluminum in the top subcell, band gap, doping level and profile, and thickness of each of the subcell layers; and fabricating a further four-junction solar cell in accordance with the modified properties of at least one of the upper first, second or third subcells.

In some embodiments, the upper first subcell is composed of indium gallium aluminum phosphide, with the amount of aluminum being at least 20% by mole fraction.

In some embodiments, the determination of the amount of radiation at a predetermined time is 1 MeV electron equivalent fluence of $1\times10^{15}$ electrons/cm$^2$.

In some embodiments, the determination of the amount of radiation at a predetermined time is 1 MeV electron equivalent fluence is between $5\times10^{14}$ electrons/cm$^2$ and $5\times10^{15}$ electrons/cm$^2$.

In some embodiments, the determination of the specific earth orbit is either a low earth orbit (LEO) or geosynchronous earth orbit (GEO).

In some embodiments, the step of identifying the composition of subcells utilizes the design rule of incorporating at least 20% aluminum by mole fraction in the composition of at least the top subcell.

In some embodiments, the addition to identifying the composition and band gaps of the upper first, second and third solar subcells, a determination of the open circuit voltage, the short circuit density, the doping level, and the thickness of the subcell layers are considered.

In some embodiments, a consideration of the parameter $E_g/q-V_{oc}$, is utilized in the identifying step.

In some embodiments, the solar cell efficiency measured at high temperature (70° C.) is at least 24.4% for a predetermined time of fifteen years.

In some embodiments, the selection of the composition of the subcells and their band gaps is designed to provide a minimum, but not maximum, efficiency at the time of initial deployment (referred to as the beginning of life or BOL).

In some embodiments, the selection of the composition of the subcells and their band gaps maximizes the efficiency at a predetermined high temperature (in the range of 50 to 100 degrees Centigrade) in deployment in space at AM0 at a predetermined time after initial deployment, such predetermined time being between one and twenty-five years and referred to as the end-of-life (EOL), and not at the beginning of life (BOL).

In another aspect, the present disclosure provides a method of manufacturing a four junction solar cell comprising providing a germanium substrate; growing on the germanium substrate a lattice matched sequence of layers of semiconductor material using a metal organic chemical vapor disposition process to form a solar cell comprising a plurality of subcells including a third subcell disposed over and lattice matched to the germanium substrate, a second subcell disposed over and lattice matched to the third subcell and having a band gap in the range of approximately 1.65 to 1.8 eV and an upper first subcell disposed over and lattice matched to the second subcell and having a band gap in the range of 2.0 to 2.15 eV, such that the average band gap of all four subcells (i.e., the sum of the four band gaps of each subcell divided by four) is greater than 1.44 eV, and the lattice constant of each of the subcells is 5.653 Angstroms.

In another aspect, the present disclosure provides a method of fabricating a four junction solar cell comprising an upper first solar subcell composed of indium gallium aluminum phosphide and having a first band gap a second solar subcell adjacent to said first solar subcell including an emitter layer composed of indium gallium phosphide or aluminum gallium arsenide, and a base layer composed of aluminum gallium arsenide and having a second band gap smaller than the first band gap and being lattice matched with the upper first solar subcell a third solar subcell adjacent to said second solar subcell and composed of indium gallium arsenide and having a third band gap smaller than the second band gap and being lattice matched with the second solar subcell; and a fourth solar subcell adjacent to said third solar subcell and composed of germanium having a fourth band gap smaller than the third band gap; wherein the selection of the composition of the subcells and their band gaps maximizes the efficiency at high temperature (in the range of 50 to 100 degrees Centigrade) in deployment in space at a specific predetermined time after the initial deployment (referred to as the beginning of life or BOL), such predetermined time being referred to as the end-of-life (EOL), and being at least one year after the BOL, and does not maximize the efficiency at BOL In some embodiments, the fourth subcell is germanium.

In some embodiments, the fourth subcell is InGaAs, GaAsSb, InAsP, InAlAs, or SiGeSn, InGaAsN, InGaAsNSb, InGaAsNBi, InGaAsNSbBi, InGaSbN, InGaBiN, InGaSb-BiN.

In some embodiments, the fourth subcell has a band gap of approximately 0.67 eV, the third subcell has a band gap of approximately 1.41 eV, the second subcell has a band gap in the range of approximately 1.65 to 1.8 eV and the upper first subcell has a band gap in the range of 2.0 to 2.2 eV.

In some embodiments, the second subcell has a band gap of approximately 1.73 eV and the upper first subcell has a band gap of approximately 2.10 eV.

In some embodiments, the upper first subcell is composed of indium gallium aluminum phosphide; the second solar subcell includes an emitter layer composed of indium gallium phosphide or aluminum gallium arsenide, and a base layer composed of aluminum gallium arsenide; the third solar subcell is composed of indium gallium arsenide; and the fourth subcell is composed of germanium.

In some embodiments, there further comprises a distributed Bragg reflector (DBR) layer adjacent to and between the third and the fourth solar subcells and arranged so that light can enter and pass through the third solar subcell and at least a portion of which can be reflected back into the third solar subcell by the DBR layer.

In some embodiments, there further comprises a distributed Bragg reflector (DBR) layer adjacent to and between the second and the third solar subcells and arranged so that light can enter and pass through the through the third solar subcell and at least a portion of which can be reflected back into the third solar subcell by the DBR layer.

In some embodiments, the distributed Bragg reflector layer is composed of a plurality of alternating layers of lattice matched materials with discontinuities in their respective indices of refraction.

In some embodiments, the difference in refractive indices between alternating layers is maximized in order to minimize the number of periods required to achieve a given reflectivity, and the thickness and refractive index of each period determines the stop band and its limiting wavelength.

In some embodiments, the DBR layer includes a first DBR layer composed of a plurality of p type $Al_xGa_{1-x}As$ layers, and a second DBR layer disposed over the first DBR layer and composed of a plurality of n or p type $Al_yGa_{1-y}As$ layers, where y is greater than x.

In some embodiments, additional layer(s) may be added or deleted in the cell structure without departing from the scope of the present disclosure.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The invention will be better and more fully appreciated by reference to the following detailed description when considered in conjunction with the accompanying drawings, wherein.

GLOSSARY OF TERMS

Figure 1:
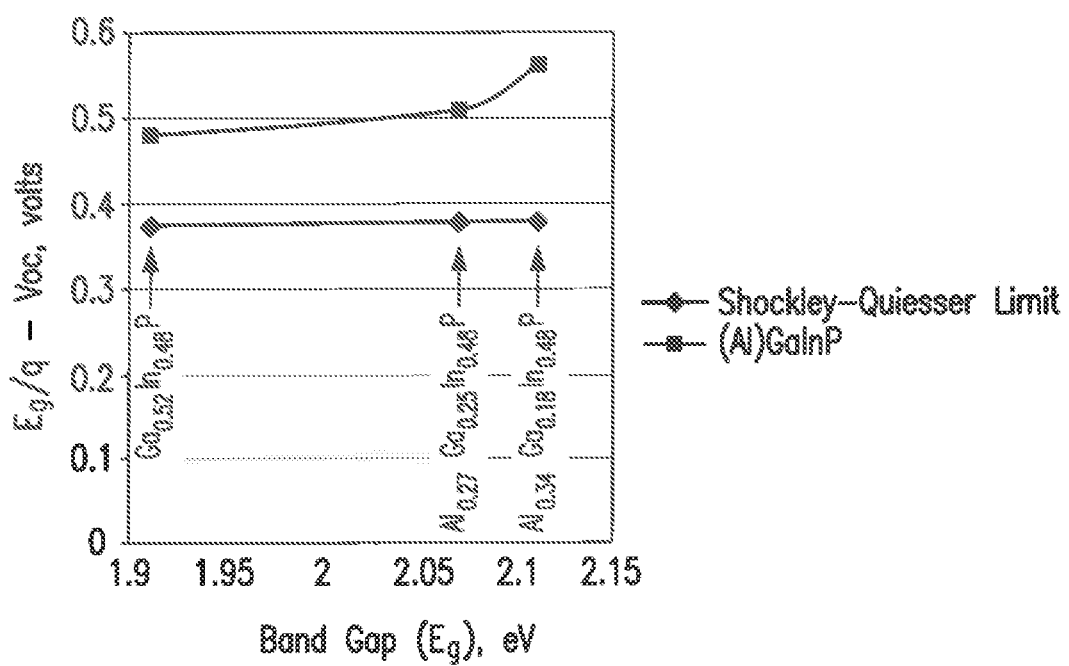
FIG. 1 is a graph representing the BOL value of the parameter $E_g/q-V_{oc}$ at 28° C. plotted against the band gap of certain binary materials defined along the x-axis.

"III-V compound semiconductor" refers to a compound semiconductor formed using at least one elements from group III of the periodic table and at least one element from group V of the periodic table. III-V compound semiconductors include binary, tertiary and quaternary compounds. Group QI includes boron (B), aluminum (Al), gallium (Ga), indium (In) and thallium (T). Group V includes nitrogen (N), phosphorus (P), arsenic (As), antimony (Sb) and bismuth (Bi).

"Band gap" refers to an energy difference (e.g., in electron volts (eV)) separating the top of the valence band and the bottom of the conduction band of a semiconductor material.

"Beginning of Life (BOL)" refers to the time at which a photovoltaic power system is initially deployed in operation.

"Bottom subcell" refers to the subcell in a multijunction solar cell which is furthest from the primary light source for the solar cell.

"Compound semiconductor" refers to a semiconductor formed using two or more chemical elements.

"Current density" refers to the short circuit current density $J_{sc}$ through a solar subcell through a given planar area, or volume, of semiconductor material constituting the solar subcell.

"Deposited", with respect to a layer of semiconductor material, refers to a layer of material which is epitaxially grown over another semiconductor layer.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Graded interlayer" (or "grading interlayer")—see "metamorphic layer".

"Inverted metamorphic multijunction solar cell" or "IMM solar cell" refers to a solar cell in which the subcells are deposited or grown on a substrate in a "reverse" sequence such that the higher band gap subcells, which would normally be the "top" subcells facing the solar radiation in the final deployment configuration, are deposited or grown on a growth substrate prior to depositing or growing the lower band gap subcells.

"Layer" refers to a relatively planar sheet or thickness of semiconductor or other material. The layer may be deposited or grown, e.g., by epitaxial or other techniques.

"Lattice mismatched" refers to two adjacently disposed materials or layers (with thicknesses of greater than 100 nm) having in-plane lattice constants of the materials in their fully relaxed state differing from one another by less than 0.02% in lattice constant. (Applicant expressly adopts this definition for the purpose of this disclosure, and notes that this definition is considerably more stringent than that proposed, for example, in U.S. Pat. No. 8,962,993, which suggests less than 0.6% lattice constant difference).

"Metamorphic layer" or "graded interlayer" refers to a layer that achieves a gradual transition in lattice constant generally throughout its thickness in a semiconductor structure.

"Middle subcell" refers to a subcell in a multijunction solar cell which is neither a Top Subcell (as defined herein) nor a Bottom Subcell (as defined herein).

"Short circuit current ($I_{sc}$)" refers to the amount of electrical current through a solar cell or solar subcell when the voltage across the solar cell is zero volts, as represented and measured, for example, in units of milliamps.

"Short circuit current density"—see "current density".

"Solar cell" refers to an electronic device operable to convert the energy of light directly into electricity by the photovoltaic effect.

"Solar cell assembly" refers to two or more solar cell subassemblies interconnected electrically with one another.

"Solar cell subassembly" refers to a stacked sequence of layers including one or more solar subcells.

"Solar subcell" refers to a stacked sequence of layers including a p-n photoactive junction composed of semiconductor materials. A solar subcell is designed to convert photons over different spectral or wavelength bands to electrical current.

"Substantially current matched" refers to the short circuit current through adjacent solar subcells being substantially identical (i.e. within plus or minus 1%).

"Top subcell" or "upper subcell" refers to the subcell in a multijunction solar cell which is closest to the primary light source for the solar cell.

"ZTJ" refers to the product designation of a commercially available SolAero Technologies Corp. triple junction solar cell.

DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells (as well as inverted metamorphic multijunction solar cells) are disclosed in the related applications noted above. Some, many or all of such features may be included in the structures and processes associated with the lattice matched or "upright" solar cells of the present disclosure. However, more particularly, the present disclosure is directed to the fabrication of a multijunction lattice matched solar cell grown on a single growth substrate. More specifically, however, in some embodiments, the present disclosure relates to four junction solar cells with direct band gaps in the range of 2.0 to 2.15 eV (or higher) for the top subcell, and (i) 1.65 to 1.8 eV, and (ii) 1.41 eV for the middle subcells, and 0.6 to 0.8 eV indirect bandgaps, for the bottom subcell, respectively.

Another way of characterizing the present disclosure is that in some embodiments of a four junction cell, aluminum is added to the top subcell in an amount of greater than 20% by mole fraction, and to the middle subcells, so that the resulting average band gap of all four subcells (i.e., the sum of the four band gaps of each subcell divided by four) is greater than 1.44 eV.

Another way of characterizing the present disclosure is that in some embodiments of a four junction solar cell, the average band gap of all four subcells (i.e., the sum of the four band gaps of each subcell divided by 4) is greater than 1.44 eV, and each subcell has a lattice constant of 5.653 Angstroms.

In some embodiments, the fourth subcell is germanium, while in other embodiments the fourth subcell is InGaAs, GaAsSb, InAsP, InAlAs, or SiGeSn, InGaAsN, InGaAsNSb, InGaAsNBi, InGaAsNSbBi, InGaSbN, InGaBiN, InGaSbBiN or other III-V or II-VI compound semiconductor material.

Another descriptive aspect of the present disclosure is to characterize the fourth subcell as having a direct band gap of greater than 0.75 eV.

The indirect band gap of germanium at room temperature is about 0.66 eV, while the direct band gap of germanium at room temperature is 0.8 eV. Those skilled in the art will normally refer to the "band gap" of germanium as 0.66 eV, since it is lower than the direct band gap value of 0.8 eV.

The recitation that "the fourth subcell has a direct band gap of greater than 0.75 eV" is therefore expressly meant to include germanium as a possible semiconductor for the fourth subcell, although other semiconductor material can be used as well.

More specifically, the present disclosure intends to provide a relatively simple and reproducible technique that does not employ inverted processing associated with inverted metamorphic multijunction solar cells, and is suitable for use in a high volume production environment in which various semiconductor layers are grown on a growth substrate in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

The lattice constants and electrical properties of the layers in the semiconductor structure are preferably controlled by specification of appropriate reactor growth temperatures and times, and by use of appropriate chemical composition and dopants. The use of a deposition method, such as Molecular Beam Epitaxy (MBE), Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type, and are within the scope of the present disclosure.

The present disclosure is in one embodiment directed to a growth process using a metal organic chemical vapor deposition (MOCVD) process in a standard, commercially available reactor suitable for high volume production. Other embodiments may use other growth technique, such as MBE. More particularly, regardless of the growth technique, the present disclosure is directed to the materials and fabrication steps that are particularly suitable for producing commercially viable multijunction solar cells or inverted metamorphic multijunction solar cells using commercially available equipment and established high-volume fabrication processes, as contrasted with merely academic expositions of laboratory or experimental results.

Some comments about MOCVD processes used in one embodiment are in order here.

It should be noted that the layers of a certain target composition in a semiconductor structure grown in an MOCVD process are inherently physically different than the layers of an identical target composition grown by another process, e.g. Molecular Beam Epitaxy (MBE). The material quality (i.e., morphology, stoichiometry, number and location of lattice traps, impurities, and other lattice defects) of an epitaxial layer in a semiconductor structure is different depending upon the process used to grow the layer, as well as the process parameters associated with the growth. MOCVD is inherently a chemical reaction process, while MBE is a physical deposition process. The chemicals used in the MOCVD process are present in the MOCVD reactor and interact with the wafers in the reactor, and affect the composition, doping, and other physical, optical and electrical characteristics of the material. For example, the precursor gases used in an MOCVD reactor (e.g. hydrogen) are incorporated into the resulting processed wafer material, and have certain identifiable electro-optical consequences which are more advantageous in certain specific applications of the semiconductor structure, such as in photoelectric conversion in structures designed as solar cells. Such high order effects of processing technology do result in relatively minute but actually observable differences in the material quality grown or deposited according to one process technique compared to another. Thus, devices fabricated at least in part using an MOCVD reactor or using a MOCVD process have inherent different physical material characteristics, which may have an advantageous effect over the identical target material deposited using alternative processes.

Prior to discussing the specific embodiments of the present disclosure, a brief discussion of some of the issues associated with the design of multijunction solar cells, and in particular inverted metamorphic solar cells, and the context of the composition or deposition of various specific layers in embodiments of the product as specified and defined by Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and the ultimate solar cell design proposed by the Applicants.

In view of the foregoing, it is further evident that the identification of one particular constituent element (e.g. indium, or aluminum) in a particular subcell, or the thickness, band gap, doping, or other characteristic of the incorporation of that material in a particular subcell, is not a "result effective variable" that one skilled in the art can simply specify and incrementally adjust to a particular level and thereby increase the efficiency of a solar cell. The efficiency of a solar cell is not a simple linear algebraic equation as a function of the amount of gallium or aluminum or other element in a particular layer. The growth of each of the epitaxial layers of a solar cell in a reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and unexpected results, and constitute an "inventive step".

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The conventional wisdom for many years has been that in a monolithic multijunction tandem solar cell, " . . . the desired optical transparency and current conductivity between the top and bottom cells . . . would be best achieved by lattice matching the top cell material to the bottom cell material. Mismatches in the lattice constants create defects or dislocations in the crystal lattice where recombination centers can occur to cause the loss of photogenerated minority carriers, thus significantly degrading the photovoltaic quality of the device. More specifically, such effects will decrease the open circuit voltage ($V_{oc}$), short circuit current ($J_{sc}$), and fill factor (FF), which represents the relationship or balance between current and voltage for effective output" (Jerry M. Olson, U.S. Pat. No. 4,667,059, "Current and Lattice Matched Tandem Solar Cell").

As progress has been made toward higher efficiency multijunction solar cells with four or more subcells, nevertheless, "it is conventionally assumed that substantially lattice-matched designs are desirable because they have proven reliability and because they use less semiconductor material than metamorphic solar cells, which require relatively thick buffer layers to accommodate differences in the lattice constants of the various materials" (Rebecca Elizabeth Jones-Albertus et al., U.S. Pat. No. 8,962,993).

Even more recently " . . . current output in each subcell must be the same for optimum efficiency in the series—connected configuration" (Richard R. King et al., U.S. Pat. No. 9,099,595).

The present disclosure provides an unconventional four junction design (with three grown lattice matched subcells, which are lattice mismatched to the Ge substrate) that leads to significant performance improvement over that of traditional three junction solar cell on Ge despite the substantial current mismatch present between the top three junctions and the bottom Ge junction. This performance gain is especially realized at high temperature and after high exposure to space radiation by the proposal of incorporating high band gap semiconductors that are inherently more resistant to radiation and temperature.

One aspect of the present disclosure relates to the use of aluminum in the active layers of the upper subcells in a multijunction solar cell. The effects of increasing amounts of aluminum as a constituent element in an active layer of a subcell affects the photovoltaic device performance. One measure of the "quality" or "goodness" of a solar cell junction is the difference between the band gap of the semiconductor material in that subcell or junction and the $V_{oc}$, or open circuit voltage, of that same junction. The smaller the difference, the higher the $V_{oc}$ of the solar cell junction relative to the band gap, and the better the performance of the device. $V_{oc}$ is very sensitive to semiconductor material quality, so the smaller the $E_g/q - V_{oc}$ of a device, the higher the quality of the material in that device. There is a theoretical limit to this difference, known as the Shockley-Queisser limit. That is the best that a solar cell junction can be under a given concentration of light at a given temperature.

The experimental data obtained for single junction (Al) GaInP solar cells indicates that increasing the Al content of the junction leads to a larger $V_{oc} - E_g/q$ difference, indicating that the material quality of the junction decreases with increasing Al content. FIG. 1 shows this effect. The three compositions cited in the Figure are all lattice matched to GaAs, but have differing Al composition. Adding Al increases the band gap of the junction, but in so doing also increases $V_{oc} - E_g/q$. Hence, we draw the conclusion that adding Al to a semiconductor material degrades that material such that a solar cell device made out of that material does not perform relatively as well as a junction with less Al.

Figure 2:
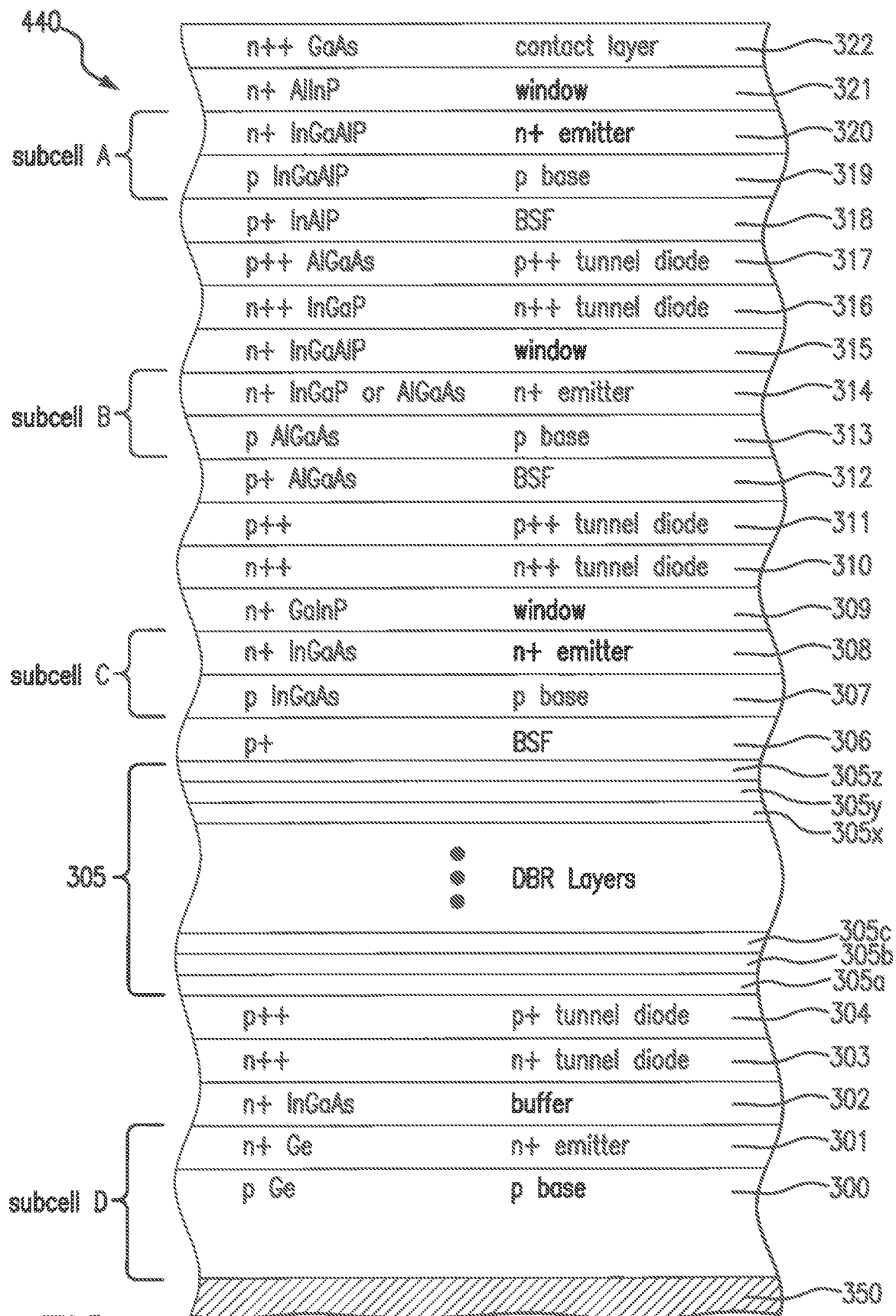
FIG. 2 is a cross-sectional view of the solar cell of a four junction solar cell after several stages of fabrication including the deposition of certain semiconductor layers on the growth substrate up to the grid lines, according to a first embodiment.

FIG. 2 illustrates a particular example of a multijunction solar cell device 440 according to the present disclosure.

As shown in the illustrated example of FIG. 2, the bottom subcell D includes a substrate 300 formed of p-type germanium ("Ge") which also serves as a base layer. A back metal contact pad 350 formed on the bottom of base layer 300 provides electrical contact to the multijunction solar cell 440. The bottom subcell D, further includes, for example, a highly doped n-type Ge emitter layer 301, and an n-type indium gallium arsenide ("InGaAs") nucleation layer 302. The nucleation layer is deposited over the base layer, and the emitter layer is formed in the substrate by diffusion of deposits into the Ge substrate, thereby forming the n-type Ge layer 301. Heavily doped p-type aluminum gallium arsenide ("AlGaAs") and heavily doped n-type gallium arsenide ("GaAs") tunneling junction layers 304, 303 may be deposited over the nucleation layer to provide a low resistance pathway between the bottom and middle subcells.

Distributed Bragg reflector (DBR) layers 305 are then grown adjacent to and between the tunnel diode 303, 304 of the bottom subcell D and the third solar subcell C. The DBR layers 305 are arranged so that light can enter and pass through the third solar subcell C and at least a portion of which can be reflected back into the third solar subcell C by the DBR layers 305. In the embodiment depicted in FIG. 2, the distributed Bragg reflector (DBR) layers 305 are specifically located between the third solar subcell C and tunnel diode layers 304, 303; in other embodiments, the distributed Bragg reflector (DBR) layers may be located between tunnel diode layers 3041303 and subcell D.

For some embodiments, distributed Bragg reflector (DBR) layers 305 can be composed of a plurality of alternating layers 305a through 305z of lattice matched materials with discontinuities in their respective indices of refraction. For certain embodiments, the difference in refractive indices between alternating layers is maximized in order to minimize the number of periods required to achieve a given reflectivity, and the thickness and refractive index of each period determines the stop band and its limiting wavelength.

For some embodiments, distributed Bragg reflector (DBR) layers 305a through 305z includes a first DBR layer composed of a plurality of p type $Al_xGa_{1-x}As$ layers, and a second DBR layer disposed over the first DBR layer and composed of a plurality of n or p type $Al_yGa_{1-y}AS$ layers, where $0<x<1$, $0<y<1$, and y is greater than x.

In the illustrated example of FIG. 3, the subcell C includes a highly doped p-type aluminum gallium arsenide ("AlGaAs") back surface field ("BSF") layer 306, a p-type InGaAs base layer 307, a highly doped n-type indium gallium arsenide ("InGaAs") emitter layer 308 and a highly doped n-type indium aluminum phosphide ("AlInP$_2$") or indium gallium phosphide ("GaInP") window layer 309. The InGaAs base layer 307 of the subcell C can include, for example, approximately 1.5% In. Other compositions may be used as well. The base layer 307 is formed over the BSF layer 306 after the BSF layer is deposited over the DBR layers 305.

The window layer 309 is deposited on the emitter layer 308 of the subcell C. The window layer 309 in the subcell C also helps reduce the recombination loss and improves passivation of the cell surface of the underlying junctions. Before depositing the layers of the subcell B, heavily doped n-type InGaP and p-type AlGaAs (or other suitable compositions) tunneling junction layers 310, 311 may be deposited over the subcell C.

The middle subcell B includes a highly doped p-type aluminum gallium arsenide ("AlGaAs") back surface field ("BSF") layer 312, a p-type AlGaAs base layer 313, a highly doped n-type indium gallium phosphide ("InGaP$_2$") or AlGaAs layer 314 and a highly doped n-type indium gallium aluminum phosphide ("AlGaAP") window layer 315. The InGaP emitter layer 314 of the subcell B can include, for example, approximately 50% In. Other compositions may be used as well.

Before depositing the layers of the top cell A, heavily doped n-type InGaP and p-type AlGaAs tunneling junction layers 316, 317 may be deposited over the subcell B.

In the illustrated example, the top subcell A includes a highly doped p-type indium aluminum phosphide ("InAlP$_2$") BSF layer 318, a p-type InGaAlP base layer 319, a highly doped n-type InGaAlP emitter layer 320 and a highly doped n-type InAlP$_2$ window layer 321. The base layer 319 of the top subcell A is deposited over the BSF layer 318 after the BSF layer 318 is formed.

After the cap or contact layer 322 is deposited, the grid lines are formed via evaporation and lithographically patterned and deposited over the cap or contact layer 322.

Figure 3A:
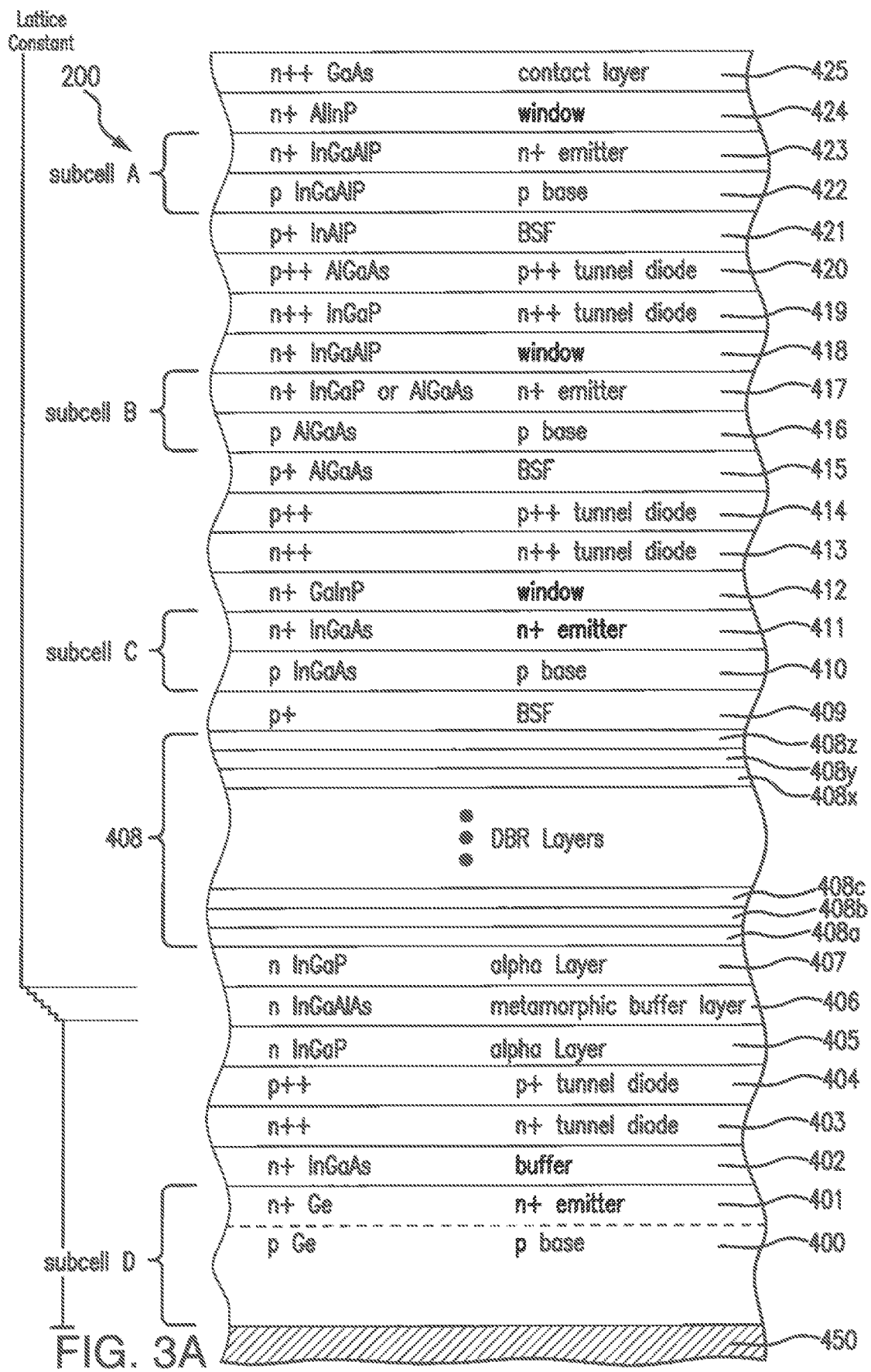
FIG. 3A is a cross-sectional view of the solar cell of a four junction solar cell after several stages of fabrication including the deposition of certain semiconductor layers on the growth substrate up to the contact layer, according to the present disclosure.

Turning to a second embodiment of the multijunction solar cell device of the present disclosure, FIG. 3A is a cross-sectional view of an embodiment of a four junction solar cell 200 after several stages of fabrication including the growth of certain semiconductor layers on the growth substrate up to the contact layer 425, with various subcells being similar to the structure described and depicted in FIG. 2.

As shown in the illustrated example of FIG. 3A, the bottom subcell D includes a substrate 400 formed of p-type germanium ("Ge") which also serves as a base layer. A back metal contact pad 450 formed on the bottom of base layer 400 provides electrical contact to the multijunction solar cell 500. The bottom subcell D, further includes, for example, a highly doped n-type Ge emitter layer 401, and an n-type indium gallium arsenide ("InGaAs") nucleation layer 402. The nucleation layer is deposited over the base layer, and the emitter layer is formed in the substrate by diffusion of deposits into the Ge substrate, thereby forming the n-type Ge layer 401. Heavily doped p-type aluminum gallium arsenide ("AlGaAs") and heavily doped n-type gallium arsenide ("GaAs") tunneling junction layers 403, 404 may be deposited over the nucleation layer to provide a low resistance pathway between the bottom and middle subcells.

A first alpha layer 405, preferably composed of n-type AlGaInAsP, is deposited over the tunnel diode 403/404, to a thickness of from 0.25 to about 1.0 micron. Such an alpha layer is intended to prevent threading dislocations from propagating, either opposite to the direction of growth into the bottom subcell D, or in the direction of growth into the subcell C, and is more particularly described in U.S. Patent Application Pub. No. 2009/0078309 A1 (Cornfeld et al.).

A metamorphic layer (or graded interlayer) 406 is deposited over the alpha layer 405 using a surfactant. Layer 406 is preferably a compositionally step-graded series of InGaAlAs layers, preferably with monotonically changing lattice constant, so as to achieve a gradual transition in lattice constant in the semiconductor structure from subcell D to subcell C while minimizing threading dislocations from occurring. The band gap of layer 406 is constant throughout its thickness, preferably approximately equal to 1.22 to 1.34 eV, or otherwise consistent with a value slightly greater than the band gap of the middle subcell C. One embodiment of the graded interlayer may also be expressed as being composed of $In_xGa_{1-x}As$, with x and y selected such that the band gap of the interlayer remains constant at approximately 1.22 to 1.34 eV or other appropriate band gap.

In the surfactant assisted growth of the metamorphic layer 406, a suitable chemical element is introduced into the reactor during the growth of layer 406 to improve the surface characteristics of the layer. In the preferred embodiment, such element may be a dopant or donor atom such as selenium (Se) or tellurium (Te). Small amounts of Se or Te are therefore incorporated in the metamorphic layer 406, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic one may use an isoelectronic surfactant. The term "isoelectronic" refers to surfactants such as antimony (Sb) or bismuth (Bi) since such elements have the same number of valence electrons as the P atom of InGaP, or the As atom in InGaAlAs, in the metamorphic buffer layer. Such Sb or Bi surfactants will not typically be incorporated into the metamorphic layer 406.

In one embodiment of the present disclosure, the layer 406 is composed of a plurality of layers of InGaAs, with monotonically changing lattice constant, each layer having the same band gap, approximately in the range of 1.22 to 1.34 eV. In some embodiments, the constant band gap is in the range of 1.27 to 1.31 eV. In some embodiments, the constant band gap is in the range of 1.28 to 1.29 eV.

The advantage of utilizing a constant bandgap material such as InGaAs is that arsenide-based semiconductor material is much easier to process in standard commercial MOCVD reactors.

Although the preferred embodiment of the present disclosure utilizes a plurality of layers of InGaAs for the metamorphic layer 406 for reasons of manufacturability and radiation transparency, other embodiments of the present disclosure may utilize different material systems to achieve a change in lattice constant from subcell C to subcell D. Other embodiments of the present disclosure may utilize continuously graded, as opposed to step graded, materials. More generally, the graded interlayer may be composed of any of the As, P, N, Sb based III-V compound semiconductors subject to the constraints of having the in-plane lattice parameter greater than or equal to that of the second solar cell and less than or equal to that of the third solar cell, and having a bandgap energy greater than that of the second solar cell.

A second alpha layer 407, preferably composed of n+ type GaInP, is deposited over metamorphic buffer layer 406, to a thickness of from 0.25 to about 1.0 micron. Such an alpha layer is intended to prevent threading dislocations from propagating, either opposite to the direction of growth into the subcell D, or in the direction of growth into the subcell C, and is more particularly described in U.S. Patent Application Pub. No. 2009/0078309 A1 (Cornfeld at al.).

Distributed Bragg reflector (DBR) layers 408 are then grown adjacent to and between the alpha layer 407 and the third solar subcell C. The DBR layers 408 are arranged so that light can enter and pass through the third solar subcell C and at least a portion of which can be reflected back into the third solar subcell C by the DBR layers 408. In the embodiment depicted in FIG. 3A, the distributed Bragg reflector (DBR) layers 408 are specifically located between the third solar subcell C and second alpha layers 407; in other embodiments, the distributed Bragg reflector (DBR) layers may be located between first alpha layer 405 and tunnel diode layers 403/404.

For some embodiments, distributed Bragg reflector (DBR) layers 408 can be composed of a plurality of alternating layers 408a through 408z of lattice matched materials with discontinuities in their respective indices of refraction. For certain embodiments, the difference in refractive indices between alternating layers is maximized in order to minimize the number of periods required to achieve a given reflectivity, and the thickness and refractive index of each period determines the stop band and its limiting wavelength.

For some embodiments, distributed Bragg reflector (DBR) layers 408a through 408z includes a first DBR layer composed of a plurality of p type $Al_xGa_{1-x}As$ layers, and a second DBR layer disposed over the first DBR layer and composed of a plurality of p type $Al_yGa_{1-y}As$ layers, where y is greater than x.

In the illustrated example of FIG. 3A, the subcell C includes a highly doped p-type aluminum gallium arsenide ("AlGaAs") back surface field ("BSF") layer 409, a p-type InGaAs base layer 410, a highly doped n-type indium gallium phosphide ("InGaP$_2$") emitter layer 411 and a highly doped n-type indium aluminum phosphide ("AlInP$_2$") window layer 412. The InGaAs base layer 410 of the subcell C can include, for example, approximately 1.5% In. Other compositions may be used as well. The base layer 410 is formed over the BSF layer 409 after the BSF layer is deposited over the DBR layers 408a through 408z.

The window layer 412 is deposited on the emitter layer 411 of the subcell C. The window layer 412 in the subcell C also helps reduce the recombination loss and improves passivation of the cell surface of the underlying junctions. Before depositing the layers of the subcell B, heavily doped n-type InGaP and p-type AlGaAs (or other suitable compositions) tunneling junction layers 413, 414 may be deposited over the subcell C.

The middle subcell B includes a highly doped p-type aluminum gallium arsenide ("AlGaAs") back surface field ("BSF") layer 415, a p-type AlGaAs base layer 416, a highly doped n-type indium gallium phosphide ("InGaP$_2$") or AlGaAs layer 417 and a highly doped n-type indium gallium aluminum phosphide ("AlGaAlP") window layer 418. The InGaP emitter layer 417 of the subcell B can include, for example, approximately 50% In. Other compositions may be used as well.

Before depositing the layers of the top cell A, heavily doped n-type InGaP and p-type AlGaAs tunneling junction layers 419, 420 may be deposited over the subcell B.

In the illustrated example, the top subcell A includes a highly doped p-type indium aluminum phosphide ("InAlP") BSF layer 421, a p-type InGaAlP base layer 422, a highly doped n-type InGaAlP emitter layer 423 and a highly doped n-type InAlP$_2$ window layer 424. The base layer 422 of the top subcell A is deposited over the BSF layer 421 after the BSF layer 421 is formed over the tunneling junction layers 419, 420 of the subcell B. The window layer 424 is deposited over the emitter layer 423 of the top subcell A after the emitter layer 423 is formed over the base layer 422.

A cap or contact layer 425 may be deposited and patterned into separate contact regions over the window layer 424 of the top subcell A. The cap or contact layer 425 serves as an electrical contact from the top subcell A to metal grid layer (not shown). The doped cap or contact layer 425 can be a semiconductor layer such as, for example, a GaAs or InGaAs layer.

After the cap or contact layer 425 is deposited, the grid lines are formed via evaporation and lithographically patterned and deposited over the cap or contact layer 425.

Figure 3B:
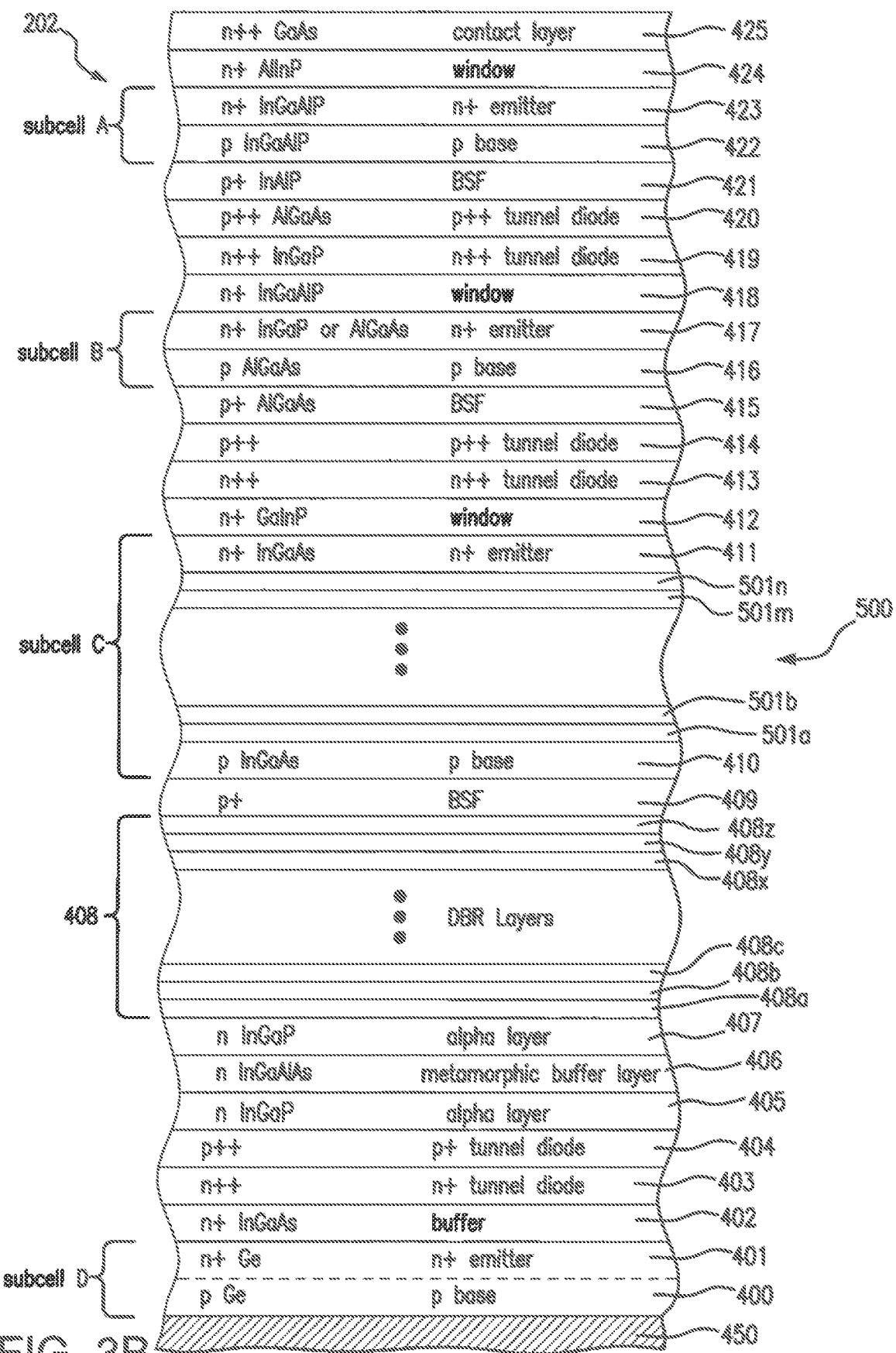
FIG. 3B is a cross-sectional view of the solar cell of a four junction solar cell after several stages of fabrication including the deposition of certain semiconductor layers on the growth substrate up to the contact layer, according to the present disclosure.

FIG. 3B is a cross-sectional view of a third embodiment of a four junction solar cell 202 after several stages of fabrication including the growth of certain semiconductor layers on the growth substrate up to the contact layer, according to the present disclosure.

The third embodiment depicted in FIG. 3B is similar to that of the second embodiment depicted in FIG. 3A except that the metamorphic buffer layer 406 is disposed beneath the tunnel diode layers 403, 404.

Figure 4:
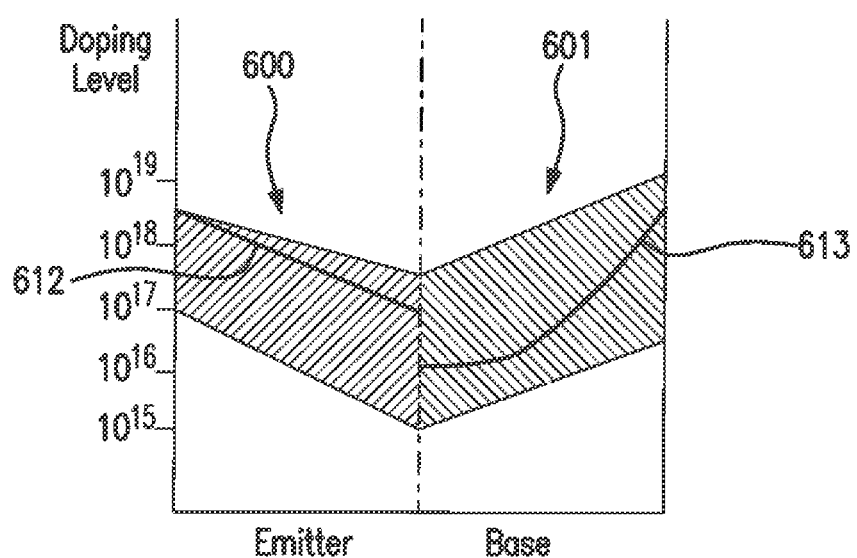
FIG. 4 is a graph of the doping profile in the base and emitter layers of a subcell in the solar cell according to the present disclosure.

In FIG. 4, layers 650, 601, and 602 are substantially identical to that of layers 450, 401, and 402 in FIG. 3, and layers 608a, 608b, . . . 625 are substantially identical to that of layers 408a, 408b, . . . 425 in FIG. 3, so such description will not be repeated here for brevity.

Similarly, the alpha layer 603, the metamorphic buffer layer 604, and alpha layer 605 are similar to that of layers 405, 406 and 407 of FIG. 3, and the tunnel diode layer 606, 607 are similar to that of layer 403, 404 of FIG. 3.

In some embodiments, at least the base of at least one of the first, second or third solar subcells has a graded doping, i.e., the level of doping varies from one surface to the other throughout the thickness of the base layer. In some embodiments, the gradation in doping is exponential. In some embodiments, the gradation in doping is incremental and monotonic.

In some embodiments, the emitter of at least one of the first, second or third solar subcells also has a graded doping, i.e., the level of doping varies from one surface to the other throughout the thickness of the emitter layer. In some embodiments, the gradation in doping is linear or monotonically decreasing.

As a specific example, the doping profile of the emitter and base layers may be illustrated in FIG. 4, which depicts the amount of doping in the emitter region and the base region of a subcell. N-type dopants include silicon, selenium, sulfur, germanium or tin. P-type dopants include silicon, zinc, chromium, or germanium.

In the example of FIG. 4, in some embodiments, one or more of the subcells have a base region having a gradation in doping that increases from a value in the range of $1\times10^5$ to $1\times10^{18}$ free carriers per cubic centimeter adjacent the p-n junction to a value in the range of $1\times10^{16}$ to $4\times10^{18}$ free carriers per cubic centimeter adjacent to the adjoining layer at the rear of the base, and an emitter region having a gradation in doping that decreases from a value in the range of approximately $5\times10^{18}$ to $\times10^{17}$ free carriers per cubic centimeter in the region immediately The present disclosure provides a multijunction solar cell that follows a design rule that one should incorporate as many high band gap subcells as possible to achieve the goal to increase the efficiency at high temperature EOL. For example, high band gap subcells may retain a greater percentage of cell voltage as temperature increases, thereby offering lower power loss as temperature increases. As a result, both HT-BOL and HT-EOL performance of the exemplary multijunction solar cell, according to the present disclosure, may be expected to be greater than traditional cells.

In view of different satellite and space vehicle requirements in terms of temperature, radiation exposure, and operational life, a range of subcell designs using the design principles of the present disclosure may be provided satisfying typical customer and mission requirements, and several embodiments are set forth hereunder, along with the computation of their efficiency at the end-of-life. The radiation exposure is experimentally measured using 1 MeV electron fluence per square centimeter (abbreviated in the text that follows as e/cm$^2$), so that a comparison can be made between the current commercial devices and embodiments of solar cells discussed in the present disclosure.

For comparison with a specific satellite mission, a low earth orbit (LEO) satellite will typically experience radiation equivalent to $5\times10^{14}$ e/cm$^2$ over a five year lifetime. A geosynchronous earth orbit (GEO) satellite will typically experience radiation in the range of $5\times10^{14}$ e/cm$^2$ to $1\times10$ e/cm$^2$ over a fifteen year lifetime.

For example, the cell efficiency (%) measured at room temperature (RT) 28° C. and high temperature (HT) 70° C., at beginning of life (BOL) and end of life (EOL), for a standard three junction commercial solar cell (ZTJ), such as depicted in FIG. 2, is as follows:

| Condition | Efficiency | |
|---|---|---|
| BOL 28° C. | 29.1% | |
| BOL 70° C. | 26.4% | |
| EOL 70° C. | 23.4% | After 5E14 e/cm$^2$ radiation |
| EOL 70° C. | 22.0% | After 1E15 e/cm$^2$ radiation |

For the four junction solar cell described in the present disclosure, the corresponding data is as follows:

| Condition | Efficiency | |
|---|---|---|
| BOL 28° C. | 29.1% | |
| BOL 70° C. | 26.5% | |
| EOL 70° C. | 24.9% | After 5E14 e/cm$^2$ radiation |
| EOL 55° C. | 24.6% | after 1E15 e/cm$^2$ radiation |
| EOL 70° C. | 24.4% | After 1E15 e/cm$^2$ radiation |

The new solar cell has a slightly higher cell efficiency than the standard commercial solar cell (ZTJ) at BOL at 70° C. However, the solar cell described in the present disclosure exhibits substantially improved cell efficiency (%) over the standard commercial solar cell (ZTJ) at 1 MeV electron equivalent fluence of $5\times10^{14}$ e/cm$^2$, and dramatically improved cell efficiency (%) over the standard commercial solar cell (ZTJ) at 1 MeV electron equivalent fluence of $1\times10^{15}$ e/cm$^2$.

The wide range of electron and proton energies present in the space environment necessitates a method of describing the effects of various types of radiation in terms of a radiation environment which can be produced under laboratory conditions. The methods for estimating solar cell degradation in space are based on the techniques described by Brown et al. [Brown, W. L., J. D. Gabbe, and W. Rosenzweig, Results of the Telstar Radiation Experiments, Bell System Technical J., 42, 1505, 1963] and Tada [Tada, H. Y., J. R. Carter, Jr., B. E. Anspaugh, and R. G. Downing, Solar Cell Radiation Handbook, Third Edition, JPL Publication 82-69, 1982]. In summary, the omnidirectional space radiation is converted to a damage equivalent unidirectional fluence at a normalised energy and in terms of a specific radiation particle. This equivalent fluence will produce the same damage as that produced by omnidirectional space radiation considered when the relative damage coefficient (RDC) is properly defined to allow the conversion. The relative damage coefficients (RDCs) of a particular solar cell structure are measured a priori under many energy and fluence levels in addition to different coverglass thickness values. When the equivalent fluence is determined for a given space environment, the parameter degradation can be evaluated in the laboratory by irradiating the solar cell with the calculated fluence level of unidirectional normally incident flux. The equivalent fluence is normally expressed in terms of 1 MeV electrons or 10 MeV protons.

The software package Spenvis (www.spenvis.oma.be) is used to calculate the specific electron and proton fluence that a solar cell is exposed to during a specific satellite mission as defined by the duration, altitude, azimuth, etc. Spenvis employs the EQFLUX program, developed by the Jet Propulsion Laboratory (JPL) to calculate 1 MeV and 10 MeV damage equivalent electron and proton fluences, respectively, for exposure to the fluences predicted by the trapped radiation and solar proton models for a specified mission environment duration. The conversion to damage equivalent fluences is based on the relative damage coefficients determined for multijunction cells [Marvin, D. C., Assessment of Multijunction Solar Cell Performance in Radiation Environments, Aerospace Report No. TOR-2000 (1210)-1, 2000]. A widely accepted total mission equivalent fluence for a geosynchronous satellite mission of 15 year duration is 1 MeV $1 \times 10^{15}$ electrons/cm$^2$.

The exemplary solar cell described herein may require the use of aluminum in the semiconductor composition of each of the top two subcells. Aluminum incorporation is widely known in the III-V compound semiconductor industry to degrade BOL subcell performance due to deep level donor defects, higher doping compensation, shorter minority carrier lifetimes, and lower cell voltage and an increased BOL $E_g/q - V_{oc}$ metric. In short, increased BOL $E_g/q - V_{oc}$ may be the most problematic shortcoming of aluminum containing subcells; the other limitations can be mitigated by modifying the doping schedule or thinning base thicknesses.

It will be understood that each of the elements described above, or two or more together, also may find a useful application in other types of structures or constructions differing from the types of structures or constructions described above.

Although described embodiments of the present disclosure utilizes a vertical stack of three subcells, various aspects and features of the present disclosure can apply to stacks with fewer or greater number of subcells, i.e. two junction cells, three junction cells, five, six, seven junction cells, etc.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell 309, with p-type and n-type InGaP is one example of a homojunction subcell.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A method of fabricating a four junction solar cell, the method comprising:

selecting a respective composition and band gap for each of an upper first solar subcell, a second solar subcell, a third solar subcell and a fourth solar subcell of the four junction solar cell so as to maximize solar cell efficiency at a temperature in the range of 50 to 100 degrees Centigrade in deployment in space at a specific predetermined time after initial deployment (referred to as beginning of life or BOL), such predetermined time being referred to as end-of-life (EOL) and being at least one year after the BOL, wherein the selecting is not designed to maximize the solar cell efficiency at the BOL, and wherein the selecting is designed to increase the solar cell efficiency at the EOL; and fabricating a test solar cell comprising the upper first solar subcell, the second solar subcell, the third solar subcell and the fourth solar subcell, wherein each particular one of said solar subcells has the respective composition and band gap selected, during said selecting, for that particular solar subcell, wherein:

the upper first solar subcell is composed of indium gallium aluminum phosphide with at least 20% aluminum by mole fraction and has a first band gap;

the second solar subcell is adjacent to said first solar subcell and includes an emitter layer composed of indium gallium phosphide or aluminum gallium arsenide, and a base layer composed of aluminum gallium arsenide, the emitter layer and the base layer forming a photovoltaic junction, wherein the second solar subcell has a second band gap smaller than the first band gap and is lattice matched with the upper first solar subcell;

the third solar subcell is adjacent to said second solar subcell, is composed of indium gallium arsenide, has a third band gap smaller than the second band gap, and is lattice matched with the second solar subcell; and the fourth solar subcell is adjacent to said third solar subcell and is composed of germanium having a fourth band gap smaller than the third band gap.

2. The method of claim 1 wherein the selecting comprises designing the fourth solar subcell to have a substantially greater current at the BOL relative to the upper first solar subcell, the second solar subcell and the third solar subcell.

3. The method of claim 1 further comprising:
determining, based on measurements of the fabricated test solar cell, at least one property of the upper first solar subcell, the second solar subcell or the third solar subcell to be modified to improve EOL solar cell efficiency, and
fabricating another four-junction solar cell in accordance with the at least one property to be modified.

4. The method of claim 3 wherein the at least one property is an aluminum content of the upper first solar subcell.

5. The method of claim 3 wherein the at least one property is a band gap, doping level, doping profile, or thickness of any one or more of the upper first solar subcell, the second solar subcell or the third solar subcell.

6. The method of claim 3 wherein determining at least one property comprises performing electrical tests that include measuring an open circuit voltage, short circuit current, and fill factor associated with the test solar cell.

7. The method of claim 1 wherein the solar cell efficiency measured at 70° C. is at least 24.4% at a predetermined time of fifteen years.

8. The method of claim 1 wherein the solar cell efficiency at the BOL is the lowest value from the BOL to the EOL.

9. The method of claim 1 wherein the fourth solar subcell has a band gap in the range of approximately 0.67 eV, the third solar subcell has a band gap in the range of approximately 1.41 eV, the second solar subcell had a band gap in the range of approximately 1.65 to 1.8 eV and the upper first solar subcell has a band gap in the range of 2.0 to 2.15 eV.

10. The method of claim 1 wherein the deployment in space is either a low earth orbit (LEO) or geosynchronous earth orbit (GEO).

11. The method of claim 1 wherein selecting the respective composition and band gap of each of the solar subcells comprises:
identifying the composition and band gaps of the upper first, second and third solar subcells; and
assessing an analysis of test results subsequently to independently incrementally adjust one or more interdependent variables, including composition of a subcell layer, thickness of the subcell layer, doping of the subcell layer, or doping profile of the subcell layer, so as to determine an open circuit voltage, short circuit density and fill factor of each of the subcell layers and thereby an overall power of output of the solar cell.

12. The method of claim 1 wherein at least one of the upper first, second and third solar subcells includes an emitter region and a base region, with the base region of such solar subcell having a gradation in doping that increases from the base-emitter junction to a bottom of the base region in the range of $1 \times 10^{15}$ to $5 \times 10^{18}$ per cubic centimeter.

13. The method of claim 1 wherein the solar cell efficiency measured at a temperature in the range of 70 to 100 degrees C. is at least 24.4% for a predetermined time of at least fifteen years after the beginning of life (BOL).

14. The method of claim 1 further comprising:
providing a distributed Bragg reflector (DBR) layer such that after fabrication of the third and fourth solar subcells, the DBR layer is adjacent to and between the third and the fourth solar subcells, and arranged so that light can enter and pass through the second and third, or the upper first solar subcell and at least a portion of the light can be reflected back into a lower one of the solar subcells by the DBR layer, wherein the distributed Bragg reflector layer is composed of a plurality of alternating layers of lattice matched materials with discontinuities in their respective indices of refraction, and a difference in refractive indices between alternating layers is maximized in order to minimize a number of periods required to achieve a given reflectivity, and a thickness and refractive index of each period determines a stop band and its limiting wavelength, and the DBR layer includes a first DBR layer composed of a plurality of p type $Al_xGa_{1-x}As$ layers, and a second DBR layer disposed over the first DBR layer and composed of a plurality of n or p type $Al_yGa_{1-y}As$ layers, where $0<x<1$, $0<y<1$, and y is greater than x.

15. The method of claim 1 wherein one or more of the solar subcells have a base region having a gradation in doping that increases exponentially from a value in the range of $1 \times 10^{15}$ to $1 \times 10^{18}$ per cubic centimeter adjacent a p-n junction to a value in the range of $1 \times 10^{16}$ to $4 \times 10^{18}$ per cubic centimeter adjacent to an adjoining layer at a rear of the base region, and an emitter region having a gradation in doping that decreases from a value in the range of $1 \times 10^{17}$ to approximately $5 \times 10^{18}$ per cubic centimeter in a region immediately adjacent the adjoining layer to a value in the range of $1 \times 10^{15}$ to $1 \times 10^{18}$ per cubic centimeter in the region adjacent to the p-n junction.

16. The method of claim 1 wherein the-specific predetermined time after initial deployment is between one and twenty-five years.

17. A method of fabricating a four junction solar cell, the method comprising:
selecting a respective composition and band gap for each of an upper first solar subcell, a second solar subcell, a third solar subcell and a fourth solar subcell of the four junction solar cell so as to maximize solar cell efficiency at a temperature in the range of 50 to 100 degrees Centigrade in deployment in space at a specific predetermined time after initial deployment (referred to as beginning of life or BOL), such predetermined time being referred to as end-of-life (EOL), and being at least one year after the BOL, wherein the selecting is not designed to maximize the solar cell efficiency at the BOL, and wherein the selecting is designed to increase the solar cell efficiency at the EOL;
fabricating one or more test solar cells each of which comprises the upper first solar subcell, the second solar subcell, the third solar subcell and the fourth solar subcell; and
determining at least one property of the upper first solar subcell, the second solar subcell or the third solar subcell to be modified to improve EOL solar cell efficiency, wherein the at least one property is an aluminum content of the upper solar subcell, or a band gap, doping level, doping profile, or thickness of any one or more of the upper first solar subcell, the second solar subcell or the third solar subcell, wherein:
- the upper first solar subcell is composed of indium gallium aluminum phosphide with at least 20% aluminum by mole fraction and has a first band gap;
- the second solar subcell is adjacent to said first solar subcell and includes an emitter layer composed of indium gallium phosphide or aluminum gallium arsenide, and a base layer composed of aluminum gallium arsenide, the emitter layer and the base layer forming a photovoltaic junction, wherein the second solar subcell has a second band gap smaller than the first band gap and is lattice matched with the upper first solar subcell;
- the third solar subcell is adjacent to said second solar subcell, is composed of indium gallium arsenide, has a third band gap smaller than the second band gap, and is lattice matched with the second solar subcell; and
- the fourth solar subcell is adjacent to said third solar subcell and is composed of germanium having a fourth band gap smaller than the third band gap.

18. A method of fabricating a four junction solar cell, the method comprising:
- selecting a respective composition and band gap for each of an upper first solar subcell, a second solar subcell, a third solar subcell and a fourth solar subcell of the four junction solar cell so as to maximize solar cell efficiency at a temperature in the range of 50 to 100 degrees Centigrade in deployment in space at a specific predetermined time after initial deployment (referred to as beginning of life or BOL), such predetermined time being referred to as end-of-life (EOL), and being at least one year after the BOL, wherein the selecting is not designed to maximize the solar cell efficiency at the BOL, and wherein the selecting is designed to increase the solar cell efficiency at the EOL; and
- fabricating a four-junction solar cell comprising the upper first solar subcell, the second solar subcell, the third solar subcell and the fourth solar subcell, wherein each particular one of said solar subcells has the respective composition and band gap selected, during said selecting, for that particular solar subcell, wherein:
- the upper first solar subcell is composed of indium gallium aluminum phosphide and has a first band gap, with the amount of aluminum being at least 20% by mole fraction;
- the second solar subcell is adjacent to said first solar subcell and includes an emitter layer composed of indium gallium phosphide or aluminum gallium arsenide, and a base layer composed of aluminum gallium arsenide, the emitter layer and the base layer forming a photovoltaic junction, wherein the second solar subcell has a second band gap smaller than the first band gap and is lattice matched with the upper first solar subcell;
- the third solar subcell is adjacent to said second solar subcell, is composed of indium gallium arsenide, has a third band gap smaller than the second band gap, and is lattice matched with the second solar subcell; and
- the fourth solar subcell is adjacent to said third solar subcell and is composed of germanium having a fourth band gap smaller than the third band gap.

* * * * *